(12) United States Patent
Okumura (10) Patent No.: US 7,064,364 B2
(45) Date of Patent: Jun. 20, 2006

(54) THIN FILM TRANSISTOR AND METHOD FOR MANUFACTURING THE SAME (75) Inventor: Hiroshi Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 38 days.

(21) Appl. No.: 10/756,505

(22) Filed: Jan. 14, 2004

(65) Prior Publication Data
US 2004/0155245 A1 Aug. 12, 2004

(30) Foreign Application Priority Data
Dec. 12, 2003 (JP) .............................. 2003-034288

(51) Int. Cl.
*H01L 29/76* (2006.01)

(52) U.S. Cl. ........................................ 257/288; 257/66
(58) Field of Classification Search ................ 257/49, 257/66, 72, 288
See application file for complete search history.

(56) References Cited

U.S. PATENT DOCUMENTS 6,327,006 B1 * 12/2001 Sato et al. .................... 349/44

FOREIGN PATENT DOCUMENTS

| JP | 4-349637 A | 12/1992 |
|----|-----------|---------|
| JP | 4-367276 A | 12/1992 |
| JP | 6-45605 A | 2/1994 |
| JP | 10-111520 A | 4/1998 |

\* cited by examiner

*Primary Examiner*—Scott Geyer
(74) *Attorney, Agent, or Firm*—Sughrue Mion, PLLC (57) ABSTRACT

A thin film transistor is provided including a transparent insulating substrate, a lower light shielding film disposed above the transparent insulating substrate, a base interlayer film disposed above the lower light shielding film, a semiconductor film disposed above the base interlayer film, wherein the semiconductor film is formed of polycrystalline silicon. A thin film transistor further comprises roughness formed at an interface between the base interlayer and the semiconductor film, a gate insulating film above the semiconductor film, and a gate electrode above the gate insulating film.

11 Claims, 7 Drawing Sheets

THIN FILM TRANSISTOR AND METHOD FOR MANUFACTURING THE SAME

BACKGROUND OF THE INVENTION

1. Field of the Invention

The present invention relates to a thin film transistor (TFT) and a manufacturing method for a TFT, and more particularly, to a thin film transistor for a liquid crystal display device such as a liquid crystal projector, an organic EL display device, etc., and to a manufacturing method therefor.

2. Description of the Related Art

In recent years, there has been realized an enhanced high performance and an enhanced high function of liquid crystal display devices (LCD), organic electroluminance (EL) display devices and the like of an active matrix type which is used for display devices of information electronic apparatuses such as personal computers and televisions.

Recently, it has been possible to manufacture liquid crystal, or EL display devices of an active matrix type including a drive circuit on an inexpensive glass substrate using poly-silicon (hereinafter referred to as poly-Si) TFTs.

Since the poly-Si TFTs are low in light sensitivity and are high in mobility as compared with a-Si TFTs, and hence miniaturization of pixel TFT has been possible, the poly-Si TFTs are useful for a liquid crystal light valve for a data projector for which miniaturization and enhanced definition are required under an environment having a high light intensity.

In addition, since the poly-Si TFTs are adapted to cause therethrough a large current as compared with the a-Si TFTs, the poly-Si TFTs are also suitable for drive devices for organic EL display devices.

Figure 1:
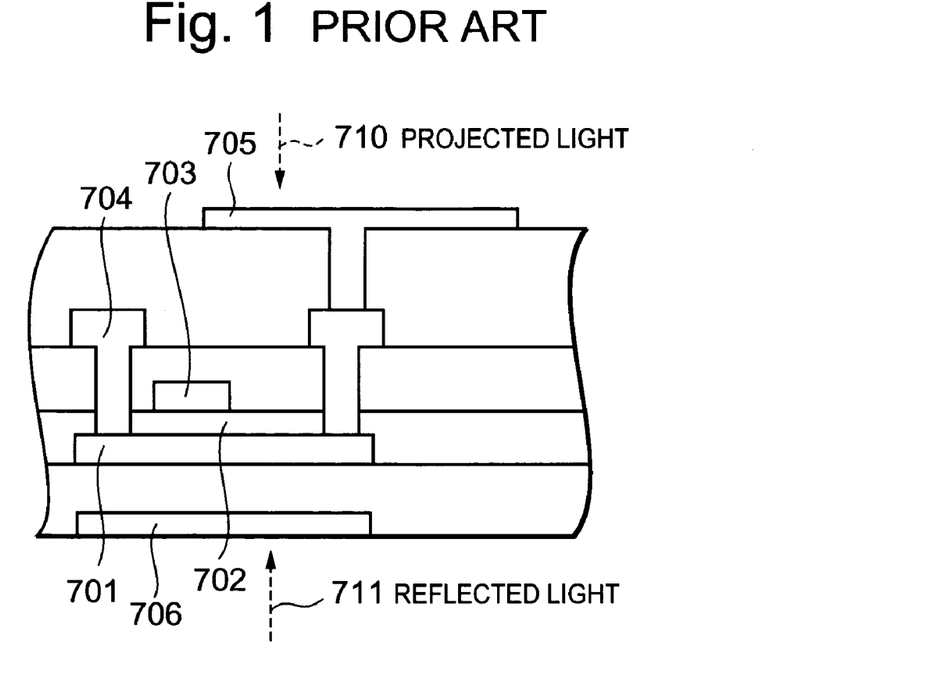
FIG. 1 is a cross sectional view of a conventional TFT for a liquid crystal light valve.

In general, as shown in FIG. 1, in addition to a thin film structure similar to a general direct viewing type liquid crystal panel including an active layer 701, a gate insulating film 702, a gate line 703, a data line 704, and a pixel electrode 705, a ground light shielding film 706 for protecting a TFT from a reflected light of a projected light from a rear face of a substrate is included for a poly-Si TFT liquid crystal light valve.

On the other hand, the a-Si TFT has a bottom gate structure, and a gate electrode serves as a light shielding film as well. But, in the a-Si TFT, a back channel side on an upper surface of a semiconductor layer becomes a main cause of a leakage current. For example, Japanese publication application H4-367276A and Japanese publication application H4-349637A discloses a technique for a-Si TFT in which a back channel surface is plasma-processed to suppress a leakage current.

Figure 2:
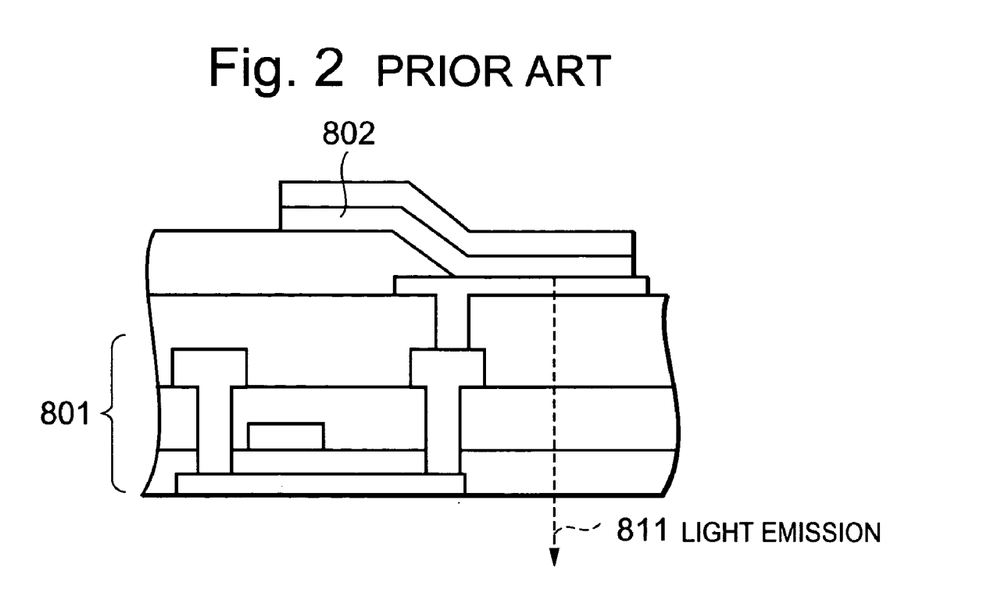
FIG. 2 is a cross sectional view of a conventional TFT for an organic EL display device.

In addition, the organic EL display device, as shown in FIG. 2, has a TFT 801 and a light emission layer 802 on the TFT, and a light from the light emission layer is directed towards a TFT substrate side. Thus, a ground light shielding film for protecting a TFT from a reflected light from a rear face of the substrate becomes necessary in some cases depending on a quantity of light from the EL light emission layer.

In general, a film made of metal, including metal compound, which is excellent in light reflection characteristics is used as a light shield film. However, since the metal film is electrically conductive, the light shield film operates a back channel of a TFT to change the TFT property. For suppression of the back channel operation by the light shield layer, a technique for sufficiently increasing a thickness of a base interlayer between a ground light shield film and a TFT active layer, or applying an electric potential to the light shield film is disclosed in a patent literature 3, for example. In accordance with this patent literature 3, a technique is disclosed in which when an electric potential of a light shield film is in a floating state, a thickness of an interlayer film is made equal to or larger than 0.8 µm, or an OFF electric potential of a TFT is applied to the light shield film.

Figure 3:
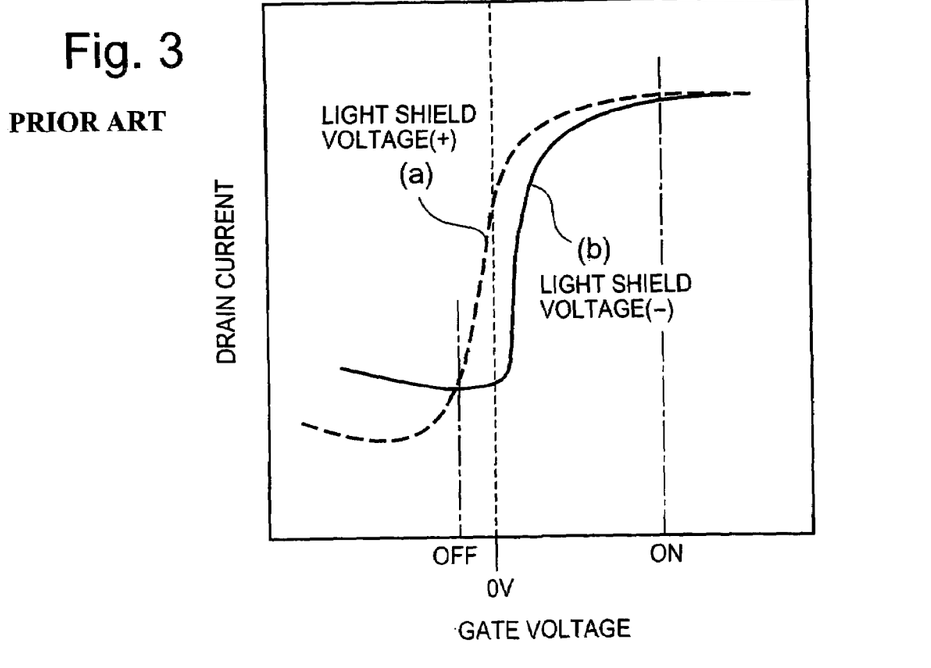
FIG. 3 is a diagram showing the operation characteristics of a conventional TFT.

However, if a thickness of a base interlayer film is increased, then a quantity of light becomes large which passes through the base interlayer film to enter an active layer. As a result, a photo leakage current is increased to cause reduction of contrast in a display device. On the other hand, if a thickness of the base interlayer film is decreased, then the TFT property becomes sensitive to an electric potential of the light shielding film. Then, when for an n-channel TFT, a negative voltage (OFF electric potential) is applied to the light shielding film as schematically shown in FIG. 3, a leakage current due to the back channel operation has a tendency to be increased.

On the other hand, when the voltage applied to the light shield film is a positive voltage, the leakage current is reduced due to the back channel operation. However, since a threshold voltage is shifted to the negative side, a current value at an OFF operating point of a TFT is increased.

As mentioned above, in a case where the base interlayer film is thinned and a voltage is applied to the light shield film, it becomes difficult to decrease the leakage current with high stability.

As a result, the OFF operation margin in individual TFTs becomes small, and hence the scattering in leakage current values among the TFT devices becomes large to cause reduction in luminance, reduction in contrast and display nonuniformity in a display device.

Figure 4:
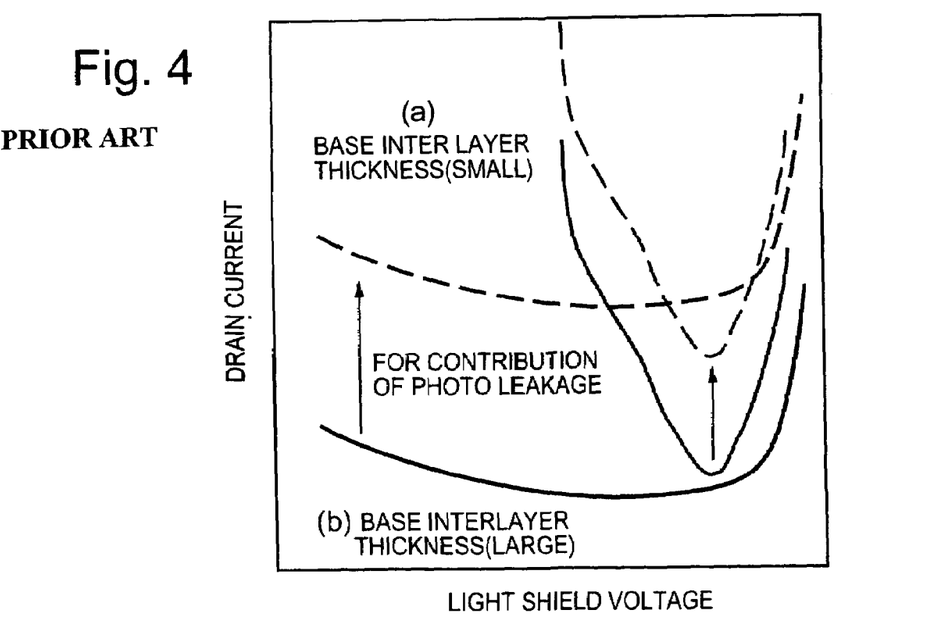
FIG. 4 is a diagram showing the operation characteristics of a conventional TFT.

The above-mentioned operation is schematically shown in FIG. 4. Here, a gate voltage is an OFF voltage. When a thickness of a base interlayer film is large, a leakage current stably shows a small value against a light shield voltage, but a contribution of a photo leakage current becomes large. On the other hand, when the thickness of the base interlayer film is small, the contribution of the photo leakage current is small, but a leakage current becomes sensitive to a light shield voltage due to the back channel operation.

SUMMARY OF THE INVENTION

An object of the present invention is to provide a low leakage current TFT and a manufacturing method therefor.

According to a first embodiment of the present invention, a thin film transistor comprises a transparent insulating substrate, a lower light shielding film disposed above the transparent insulating substrate, a base interlayer film disposed above the lower light shielding film, a semiconductor film disposed above the base interlayer film, wherein the semiconductor film is formed of polycrystalline silicon. The thin film transistor according to the first embodiment further comprises roughness formed at an interface between the base interlayer and the semiconductor film, a gate insulating film disposed above the semiconductor film, and a gate electrode disposed above the gate insulating film.

According to a second embodiment of the present invention, a thin film transistor comprises a transparent insulating substrate, a lower light shielding film disposed above the transparent insulating substrate, a base interlayer film disposed above the lower light shielding film, a semiconductor film disposed above the base interlayer film. The thin film transistor according to the second embodiment further comprises roughness formed at an interface between the base interlayer and the semiconductor film, a gate insulating film on the semiconductor film, and a gate electrode on the gate insulating film. The roughness is equal to or larger than about 5 nm and equal to or smaller than about 40 nm.

According to a third embodiment of the present invention, a method for manufacturing a thin film transistor comprises providing a transparent insulating substrate, forming a lower light shielding film above said transparent insulating substrate, forming a base interlayer film above said lower light shielding film, plasma processing a surface of said base interlayer film, forming a semiconductor film above said base interlayer film, forming a gate insulating film above said semiconductor film, and forming a gate electrode above said gate insulating film.

DETAILED DESCRIPTION OF THE INVENTION

Figure 5:
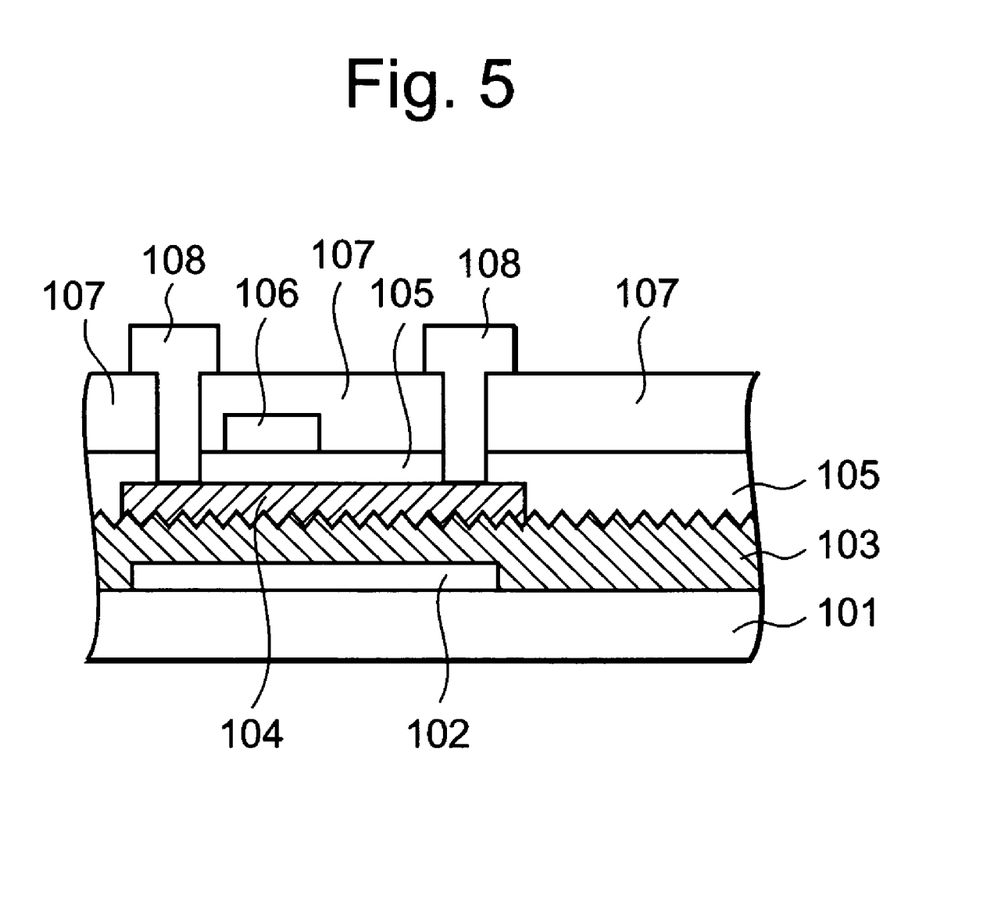
FIG. 5 is a cross sectional view of a first embodiment of the present invention.
Figure 6A:
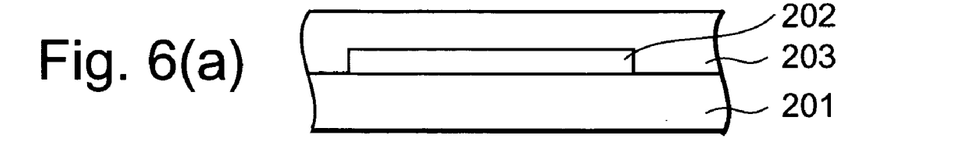
FIGS. 6(a) to (e) are cross sectional views for explaining a process of the first embodiment of the present invention
Figure 6B:
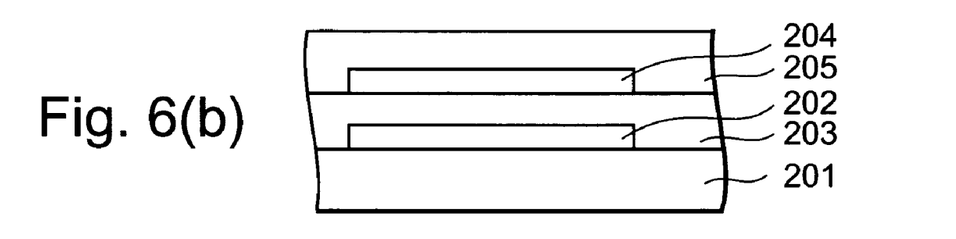
Figure 6C:
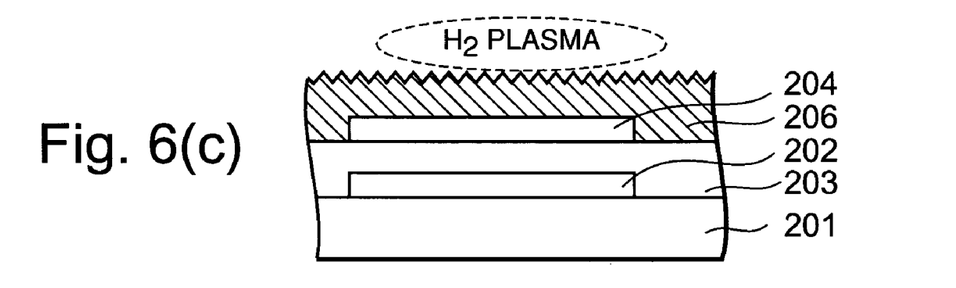
Figure 6D:
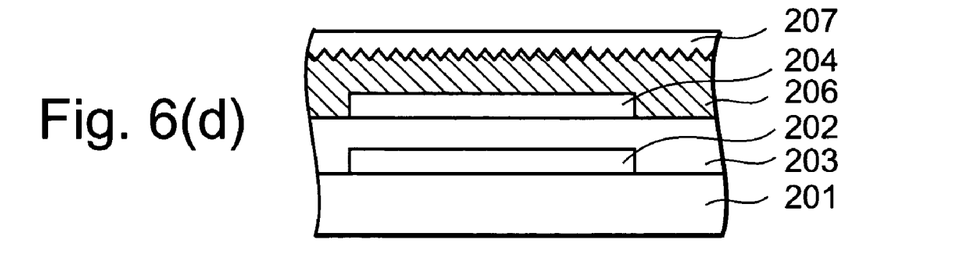
Figure 6E:
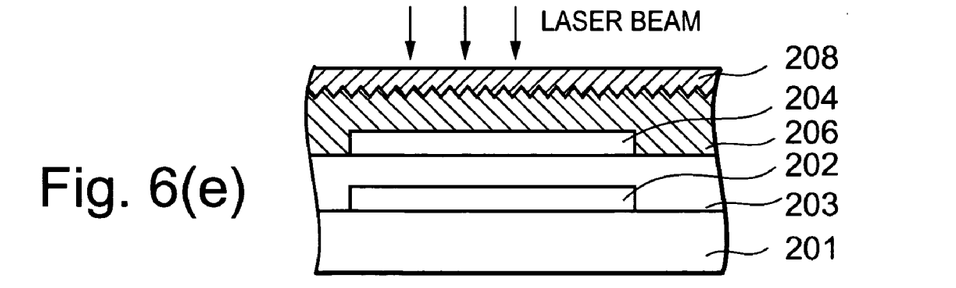

FIG. 5 shows a TFT of a first embodiment of the present invention. FIG. 5 shows a light shielding film 102, a base interlayer film 103, a poly-Si film 104 to be an active layer, a gate insulating film 105, a gate electrode 106, a second interlayer film 107, and source/drain electrodes 108 on a glass substrate 101. Also, roughness is formed in an interface between the base interlayer film 103 and the poly-Si film 104. The roughness is equal to or larger than about 5 nm, and equal to or smaller than about 40 nm. Alternatively, the roughness which is equal to or larger than about 5 nm, and equal to or smaller than about 20 nm are formed in the interface between the base interlayer film 103 and the poly-Si film 104.

In addition, a thickness of the active layer 104 may be equal to or smaller than about 80 nm for reducing a photo leakage current. When roughness is equal to or larger than ¼ of the thickness of the active layer 104 under this condition, after the laser melting and recrystallizing process, some roughness still remains on the surface to reduce TFT mobility by about 5%. Moreover, in case of roughness equal to or larger than ½ of the thickness of the active layer 104, the reduction in mobility becomes so remarkable as to be equal to or larger than 20%, and therefore roughness smaller than ½ of the thickness of the active layer 104 may be used.

A first embodiment of the present invention will be described with reference to a process drawing of FIGS. 6(a)–6(e) and a TFT structure cross sectional view of FIG. 7. Each structure, thickness, material, condition of films or process described herein is set forth as an illustrative example only and is not intended to be limiting.

A $WSi_2$ film with 100 nm thickness is deposited as a light reflection shielding film 202 on a glass substrate 201 by utilizing a sputtering method, and an island-like pattern of the light reflection shielding film 202 is formed through a normal PR method. Next, an $SiO_2$ film with 200 nm thickness is formed as a light shield interlayer film 203 by utilizing a PECVD method. (FIG. 6(a))

Next, an $n^+$ type a-Si film with 100 nm thickness is deposited as a light absorption light shielding film 204 by utilizing the PECVD method, then an island-like pattern of the light absorption light shielding film 204 is formed through the normal PR method. Next, an $SiO_2$ film with 200 nm thickness is formed as a base interlayer film 205 by utilizing the PECVD method. (FIG. 6(b))

Subsequently, a surface of the base interlayer film 205 is subjected to a hydrogen ($H_2$) plasma processing in a different chamber within the same PECVD system. With respect to the process conditions, a flow rate of a hydrogen gas ($H_2$) is 500 sccm, a pressure is 100 Pa, a discharge output power is 1,400 W, and a discharge time is 60 seconds. Fine roughness of about 7 nm is formed on the surface of the base interlayer film 205 through this processing. (FIG. 6(c))

In the same chamber, an a-Si film with 50 nm thickness is deposited as an active layer precursor film 207 on the base interlayer film 206 having the roughness. (FIG. 6(d)) Next, a dehydrogenation annealing is carried out at 500° C. for 10 minutes. Next, an excimer laser beam is irradiated to the precursor film 207 to crystallize an a-Si into poly-Si to thereby form a poly-Si film as an active layer 208. Here, a scanning application is carried out under the conditions of a laser beam irradiation in which a beam diameter is 200×0.4 $mm^2$, energy density is 350 $mJ/cm^2$, and an overlapping rate is 95%. (FIG. 6(e))

Figure 7:
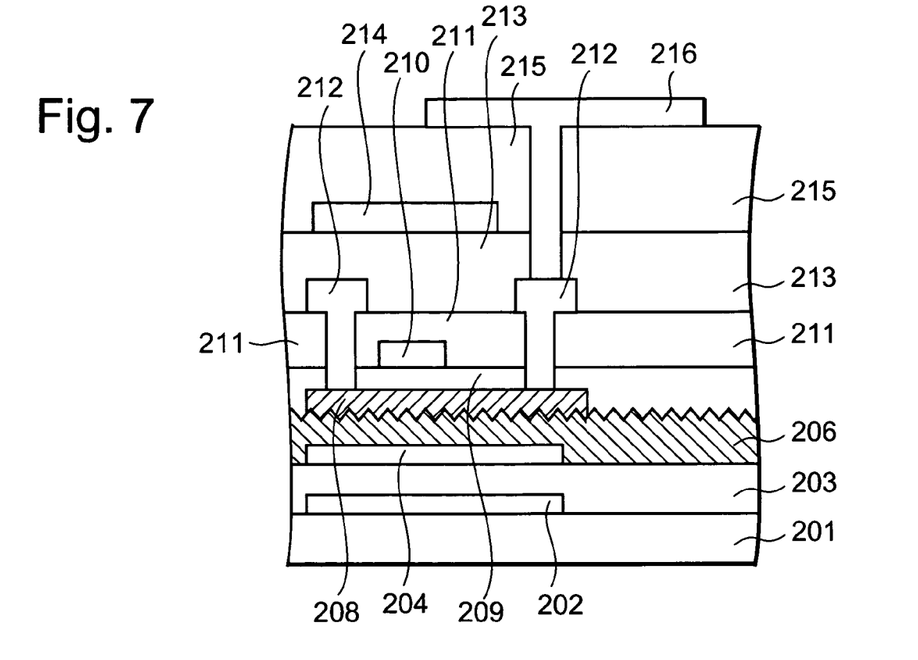
FIG. 7 is a cross sectional view of the first embodiment of the present invention.

Next, as shown in FIG. 7, the active layer 208 is patterned into an island shape by utilizing the PR method. Next, an $SiO_2$ film with 100 nm thickness is formed as a gate insulating film 209 by utilizing the PECVD method. Next, a $WSi_2$ film with 150 nm thickness is deposited as a gate line 210 by utilizing the sputtering method to be formed into an island-like pattern by utilizing the PR method. After formation of the gate line 210, areas of the active layer becoming a source, a drain and an LDD area are doped with impurities such as phosphorus (P) ions or boron (B) ions while controlling the concentration of the impurities through an ion doping method, and then are subjected to the activation heat treatment at 500° C. for 4 hours.

Next an SiN film with 300 nm thickness is formed as a second interlayer insulating film 211 by utilizing the PECVD method. Next, after contact holes are formed in desired positions by utilizing a dry etching method, an Al film with 400 nm thickness is deposited as a data line 212 by utilizing the sputtering method to be formed into an island-like pattern through the PR method. Next, an SiN film with 400 nm thickness is formed as a third interlayer insulating film 213 by utilizing the PECVD method.

Next, an Al film with 400 nm thickness is deposited as an upper black matrix (BM) 214 by utilizing the sputtering method to be formed into an island-like pattern through the PR method. Forming the BM not on an counter substrate, but on a TFT substrate becomes advantageous in terms of promotion of high aperture ratio.

Next, after an SiN film with 200 nm thickness is formed as a fourth interlayer insulating film 215 by utilizing the PECVD method, an organic flattening film with 800 nm thickness is applied to be baked. Next, after formation of contact holes utilizing the dry etching method, an ITO film with 100 nm thickness is deposited as a pixel electrode 216 by utilizing the sputtering method to be formed into an island-like pattern with the PR method. From the above processes, a poly-Si TFT substrate for a liquid crystal light valve is formed.

In this embodiment, the roughness of 7 nm is formed in the back channel of the active layer 208. The formation of the roughness impedes the movement of carriers on the back channel side to reduce the field effect mobility of carriers to thereby reduce a leakage current accompanying the back channel operation. The scattering in leakage currents among TFTs is also suppressed so that as an image after projection using a projector, the image obtained is low in display nonuniformity, high in luminance and high in contrast.

Figure 8:
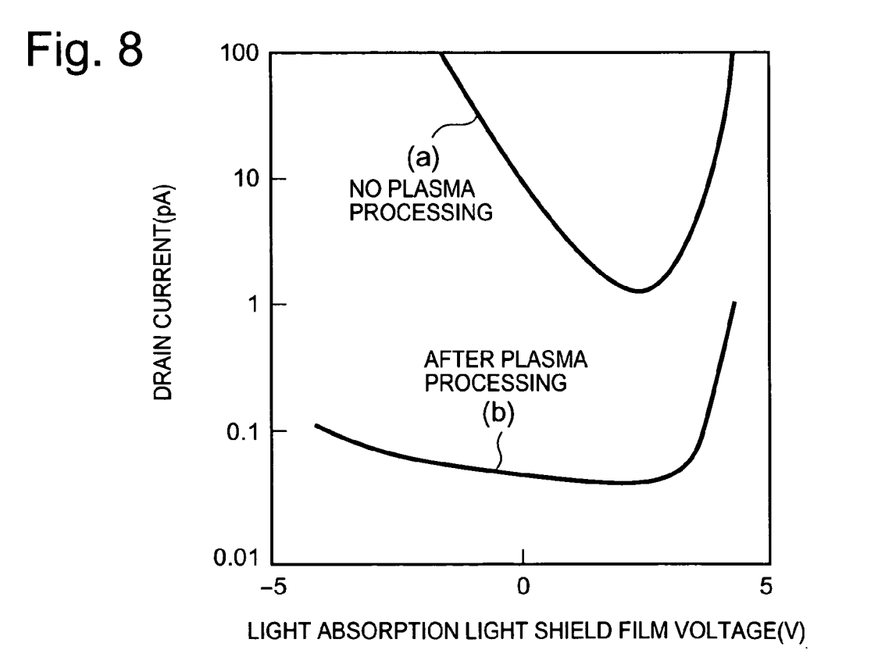
FIG. 8 is a diagram showing the operation characteristics of a TFT of the first embodiment of the present invention and a conventional TFT.
Figure 9A:
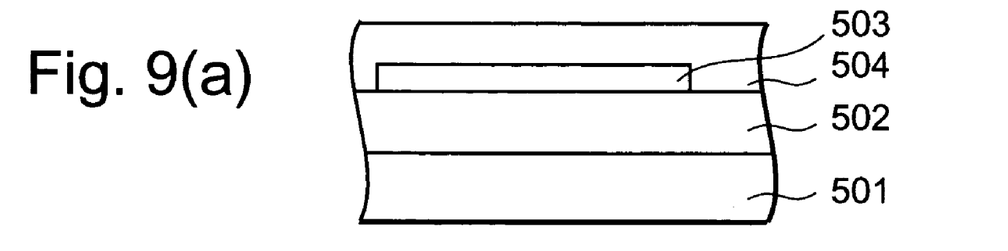
FIGS. 9(a) to (d) are cross sectional views for explaining a third embodiment of the present invention.
Figure 9B:
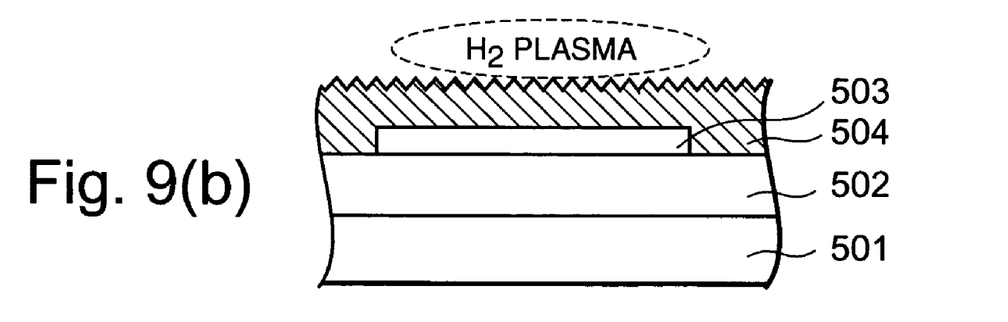
Figure 9C:
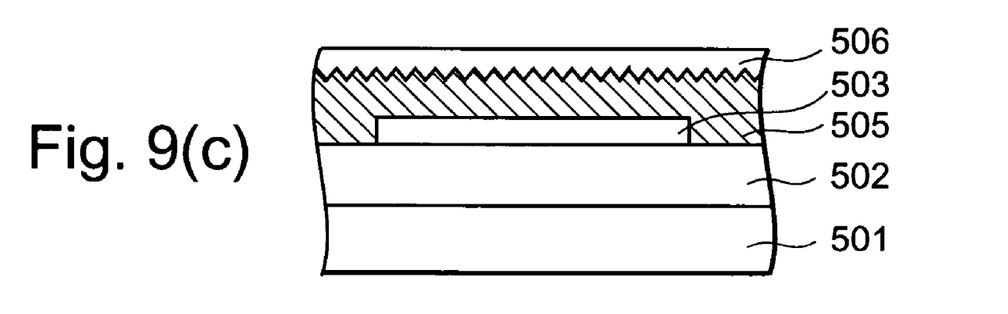
Figure 9D:
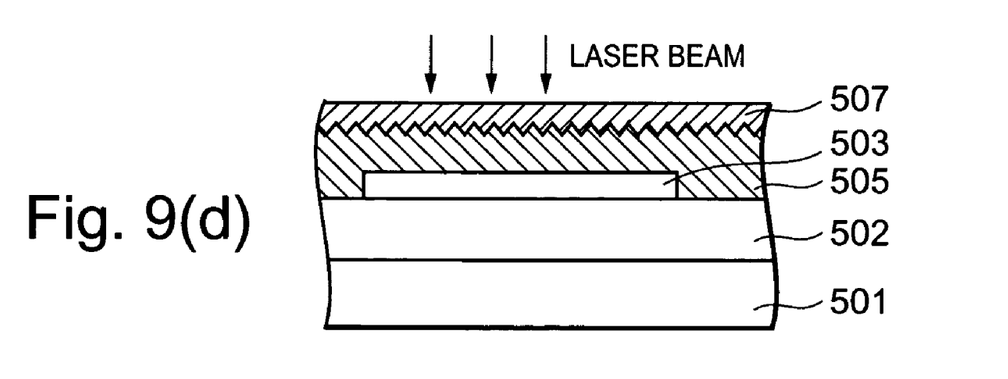

FIG. 8 shows a change in leakage current when a gate voltage is −2V, and a drain voltage is 10V in a dark state. Then, the dependency of a leakage current on a light absorption light shield film voltage becomes gradual due to the plasma processing. The effect of reduction of the leakage current due to the plasma processing in this embodiment is substantially equal to the case where the thickness thereof was increased up to 600 nm in comparison in effect of reduction of the leakage current due to only a thickness of the base interlayer film. However, if the comparison is made of photo leakage current, in the TFT of this embodiment, the photo leakage current is 8E-13A which was so small as to be about ¼ of the photo leakage current of 3E-12A in the TFT having the base interlayer film with 600 nm which is subjected to no plasma processing.

In general, when roughness is formed on a surface of a base interlayer film, these roughness may also be transferred to a surface of an active layer, which is a layer overlying the base interlayer film, to be left to thereby decrease the carrier mobility as well on the front channel side in some cases. For example, in case of a poly-Si film which is directly formed by utilizing a poly-Si formation method or which is formed by crystallizing an a-Si film through the heat treatment by utilizing a solid phase growth method, roughness is left on the surface of the film.

However, in case of the poly-Si film obtained through the laser annealing, a surface of the poly-Si film is restructured and formed by melting and recrystallization. That is, the surface of the poly-Si film is not influenced by the surface roughness of the base interlayer film. The surface of the poly-Si film depends only on the laser application conditions, for example, when the roughness is equal to or smaller than ¼ of the film thickness. Consequently, any undesirable influences of the plasma processing do not appear in the ON characteristics of a TFT. Accordingly, the roughness in the embodiment of the present invention can help not only the effect of reduction of the leakage current but also the photo leakage current.

For the plasma processing, $O_2$, Ar, He or a mixed gas thereof is used in addition to $H_2$, so that it is possible to form surface roughness in a surface of a base interlayer film. A speed of forming roughness is the highest in case of $H_2$. Consequently, the plasma processing using an $H_2$ gas of 100% purity is used.

In this embodiment, the processes from the formation of the base interlayer film up to the formation of the precursor film are continuously carried out within the same PECVD system. However, if roughness is formed in the surface of the base interlayer film, such a procedure may also be adopted such that the substrate is temporarily exposed to a room atmosphere, and the individual processes are carried out using different systems.

In a case where the precursor film is formed after a substrate has been exposed to the room atmosphere, the TFT characteristics are deteriorated due to the presence of impurities if the substrate is not cleaned. Thus, cleaning before the film formation becomes indispensable. Here, if the cleaning is carried out after the roughness has been formed, then the roughness is made smaller, and as a result, the effect of reduction of a leakage current is reduced. As disclosed in a Japanese published application H6-045605A, for example, roughness equals to or smaller than 3 nm improves mobility. Then, the plasma processing time may be prolonged in expectation of reduction in roughness due to the cleaning. However, from viewpoint of the throughput at least the plasma processing and the formation of the precursor film may be carried out within the same system.

A second embodiment of the present invention will be described below. Each structure, thickness, material, condition of films or process described herein is set forth as an illustrative example only and is not intended to be limiting.

Similar to the first embodiment, a light reflection light shielding film, a light shielding interlayer film and a light absorption light shield film are formed on a glass substrate. Next, a base interlayer film and a precursor film are continuously formed in the same process chamber within the same system in accordance with the following procedure.

The base interlayer film is formed under the condition in which a flow rate of oxygen ($O_2$) is 6,000 sccm, a flow rate of vaporized TEOS is 300 sccm, a flow rate of He is 100 sccm, a pressure is 180 Pa, and a discharge output power is 1,500 W. At a point in time when a discharge time of 120 seconds has elapsed, the supply of $O_2$ and the vaporized TEOS gas is stopped, a flow rate of He is increased up to 500 sccm, a pressure is reduced down to 50 Pa, and a discharge output power is reduced down to 100 W in order to maintain the plasma discharge. Next, after a lapse of 20 seconds, a silane gas is started to be supplied at a flow rate of 140 sccm. Next, after a lapse of 5 seconds, the supply of an He gas is stopped and the plasma discharge is maintained for a period of time of 145 seconds. Then, the discharge and the supply of all the gases are stopped.

The base interlayer film with 200 nm thickness and the active layer precursor film with 50 nm thickness are continuously formed by utilizing the above-mentioned deposition method so that roughness in the interface therebetween becomes 8 nm. In this embodiment, roughness is effectively formed owing to the effects of the He radicals and the hydrogen radicals contained in a silane gas in a state in which the film surface is activated under the plasma discharge.

Here, in a case where after formation of the base interlayer film, the discharge is temporarily stopped to change gases with each other, and then the discharge is started again to form the active layer precursor film without executing the $H_2$ plasma processing, roughness in the interface therebetween is equal to or smaller than 3 nm. After completion of the discharge, atoms of the film surface are relaxed in an instant to be deactivated so that a state of a flat surface is provided.

Whether the base interlayer film and the active layer precursor film are continuously formed under the continuous discharge or the plasma processing for formation of surface roughness is executed after temporary stop of the discharge can be selected on the basis of the system performance such as gas change-over, an exhaust capacity, a power supply capacity, an rf matching performance, a film formation rate, a substrate conveyance velocity and the like of the system.

Next, the same processes as those in the first embodiment are carried out, whereby a low leakage current TFT which has the small dependency of a light shield electric potential is formed without dispersion.

A third embodiment of the present invention will be described with reference to a process drawing of FIG. 9 and a structure cross sectional view of FIG. 10. Each structure, thickness, material, condition of films or process described herein is set forth as an illustrative example only and is not intended to be limiting.

According to the third embodiment of the present invention, first, a SiN film with 300 nm thickness is deposited as a cover film 502 on a glass substrate 501 by utilizing the PECVD method. Next, a Cr film with 150 nm thickness is deposited as a light shield film 503 by utilizing the sputtering method to be formed into an island-like pattern through the normal PR method. Next, an $SiO_2$ film with 200 nm thickness is formed as a base interlayer film 504 by utilizing the PECVD method. Subsequently, a surface of the base interlayer film 504 is subjected to the $H_2$ plasma processing within the same PECVD system. With respect to the process conditions, a flow rate of a $H_2$ was 500 sccm, a pressure is 100 Pa, a discharge output power is 1,200 W, and a discharge time is 60 seconds. (FIG. 9(a))

With this process, fine roughness with the thickness of about 5 nm is formed on the base interlayer film 504. (FIG. 9(b)) An a-Si film with 80 nm thickness is deposited as an active layer precursor film 506 on the base interlayer film 505 having the roughness in the same PECVD system. (FIG. 9(c)) Next, the dehydrogenation annealing is carried out at 400 degrees for 30 minutes. Next, an excimer laser beam is irradiated to the precursor film 506 to crystallize an a-Si into poly-Si to thereby form a poly-Si film as an active layer 507. Here, the scanning application is carried out under the conditions of a laser beam irradiation in which a beam diameter is 200×0.4 $mm^2$, energy density is 420 $mJ/cm^2$, and an overlapping rate is 95%. (FIG. 9(d))

Figure 10:
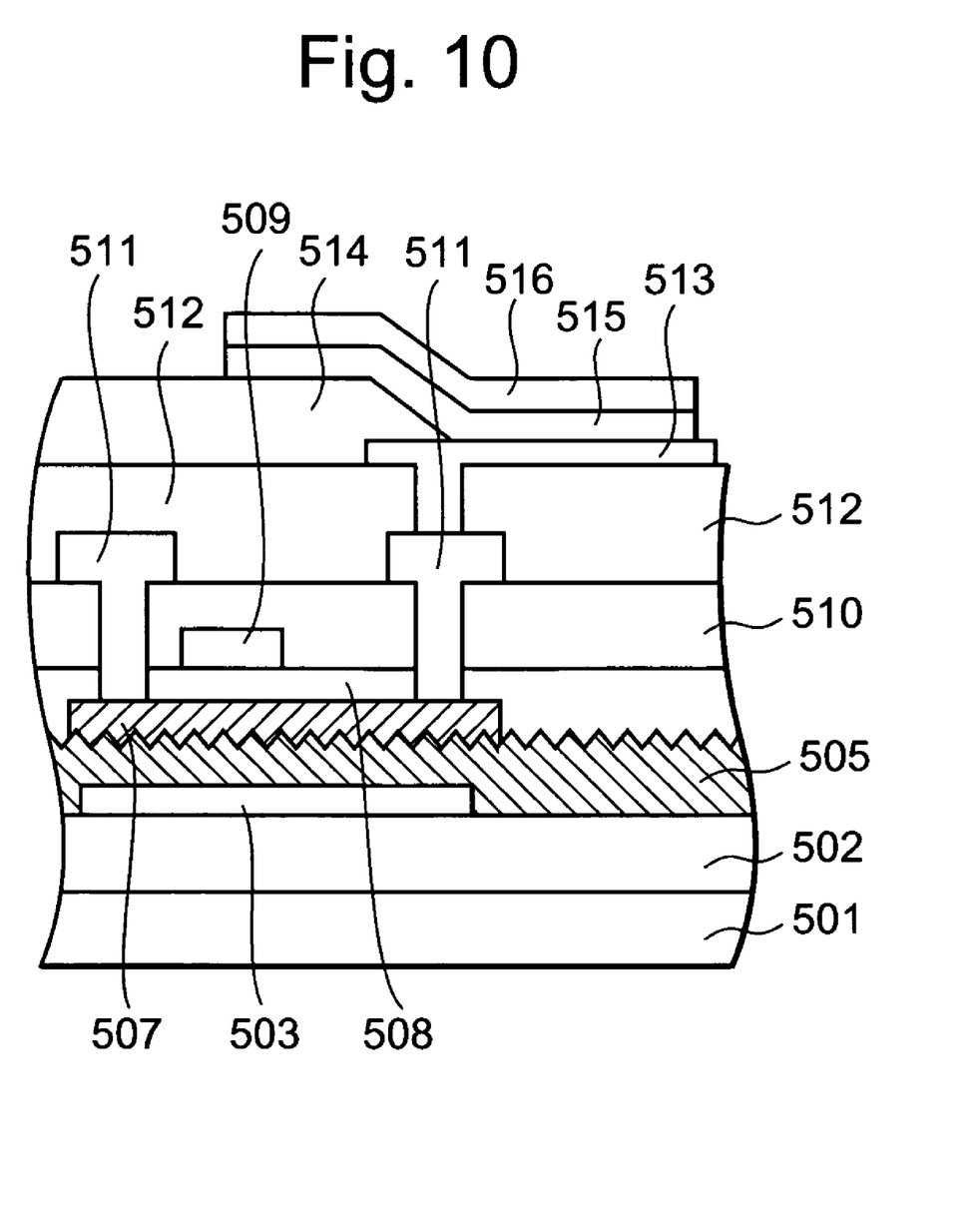
FIG. 10 is a cross sectional view of the third embodiment of the present invention.

Next, as shown in FIG. 10, the active layer 507 is patterned into an island shape through the PR method. Next, an $SiO_2$ film with 100 nm thickness is formed as a gate insulating film 508 by utilizing the PECVD method. Next, an Al film with 300 nm thickness is deposited as a gate line 509 by utilizing the sputtering method to be formed into an island-like pattern with the PR method. After formation of the gate line, areas of the active layer becoming a source, a drain and an LDD area are doped with impurities such as P ions or B ions while controlling the concentration of the impurities through the ion doping method, and then are subjected to the activation treatment by irradiating an excimer laser beam. Here, the scanning application is carried out under the conditions of a laser beam irradiation in which a beam diameter is 200×0.4 $mm^2$, energy density is 270 $mJ/cm^2$, and an overlapping rate is 60%.

Next, an $SiO_2$ film with 400 nm thickness is formed as a second interlayer insulating film 510 by utilizing the PECVD method. Next, after contact holes are formed in desired positions by utilizing the dry etching method, an Al film with 500 nm thickness is deposited as a data line 511 by utilizing the sputtering method to be formed into an island-like pattern through the PR method.

Next, an SiN film with 400 nm thickness is formed as a third interlayer insulating film 512 by utilizing the PECVD method. Next, after contact holes are formed in desired positions by utilizing the dry etching method, an ITO film with 80 nm thickness is deposited as a lower electrode 513 by utilizing the sputtering method to be formed into an island-like pattern with the PR method.

Next, photo resist is applied as a fourth interlayer insulating film 514 to form contact holes in desired positions through the PR method. Next, an EL layer 515 is selectively formed by the evaporation utilizing the metal mask method. Next, an Al film with 200 nm thickness is selectively formed as a cathode 516 by evaporation.

From the above processes, a TFT substrate for an organic EL display device is formed which is constituted by a TFT having low leakage characteristics and which can reduce the display nonuniformity.

Roughness is measured using either a transmission electron microscope (cross-section TEM) or an atomic force microscope (AFM) for "directly" observing lines of atoms on a surface of a substance utilizing an atomic force. Moreover, with respect to an index of such roughness, a center line mean roughness (Ra) may be used, or a height difference may be used which is obtained by subtracting the lowest height from the highest height measured from the mean line.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A thin film transistor comprising:
   a transparent insulating substrate;
   a lower light shielding film disposed above said transparent insulating substrate;
   a base interlayer film disposed above said lower light shielding film;
   a semiconductor film disposed above said base interlayer film, said semiconductor film formed of polycrystalline silicon;
   roughness formed at an interface between said base interlayer and said semiconductor film, wherein said roughness is equal to or larger than about 5 nm and equal to or smaller than about 40 nm;
   a gate insulating film disposed above said semiconductor film; and
   a gate electrode disposed above said gate insulating film.

2. The thin film transistor according to claim 1,
   wherein said lower light shielding film disposed on said transparent insulating substrate,
   wherein said base interlayer film disposed on said lower light shielding film,
   wherein said semiconductor film disposed on said base interlayer film, said semiconductor film formed of polycrystalline silicon,
   wherein said gate insulating film disposed on said semiconductor film, and
   wherein said gate electrode disposed on said gate insulating film.

3. The thin film transistor according to claim 1,
   wherein said roughness is equal to or larger than about 5 nm and equal to or smaller than about 20 nm.

4. The thin film transistor according to claim 1,
   wherein a thickness of said semiconductor film is equal to or smaller than about 80 nm.

5. The thin film transistor according to claim 1,
wherein a thickness of said base interlayer film is equal to or smaller than about 400 nm.

6. The thin film transistor according to claim 1,
further comprising a black matrix disposed above an upper layer of said thin film transistor.

7. A thin film transistor comprising:
a transparent insulating substrate;
a lower light shielding film disposed above said transparent insulating substrate;
a base interlayer film disposed above said lower light shielding film;
a semiconductor film disposed above said base interlayer film;
roughness formed at an interface between said base interlayer and said semiconductor film;
a gate insulating film disposed above said semiconductor film; and
a gate electrode disposed above said gate insulating film,
wherein said roughness is equal to or larger than about 5 nm and equal to or smaller than about 40 nm.

8. The thin film transistor according to claim 7,
wherein said roughness is equal to or larger than about 5 nm and equal to or smaller than about 20 nm.

9. The thin film transistor according to claim 7,
wherein a thickness of said semiconductor film is equal to or smaller than about 80 nm.

10. The thin film transistor according to claim 7,
wherein a thickness of said base interlayer film is equal to or smaller than about 400 nm.

11. The thin film transistor according to claim 7,
further comprising a black matrix disposed above an upper layer of said thin film transistor.

* * * * *